United States Patent
Teng

(10) Patent No.: US 9,437,311 B1
(45) Date of Patent: Sep. 6, 2016

(54) FLASH MEMORY APPARATUS AND INITIALIZATION METHOD FOR PROGRAMMING OPERATION THEREOF

(71) Applicant: Powerchip Technology Corporation, Hsinchu (TW)

(72) Inventor: Tsai-Ko Teng, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/841,700

(22) Filed: Aug. 31, 2015

(30) Foreign Application Priority Data

Jul. 3, 2015 (TW) .............................. 104121667 A

(51) Int. Cl.
*G11C 16/20* (2006.01)
*G11C 16/26* (2006.01)
*G11C 16/34* (2006.01)
*G11C 29/56* (2006.01)

(52) U.S. Cl.
CPC .............. *G11C 16/20* (2013.01); *G11C 16/26* (2013.01); *G11C 16/3459* (2013.01); *G11C 29/56* (2013.01)

(58) Field of Classification Search
None
See application file for complete search history.

(56) References Cited

U.S. PATENT DOCUMENTS

| 7,688,632 B2 | 3/2010 | Nagashima et al. |
| 2005/0248992 A1* | 11/2005 | Hwang ............... G11C 16/3454 365/185.28 |

* cited by examiner

*Primary Examiner* — James G Norman
(74) *Attorney, Agent, or Firm* — Jianq Chyun IP Office

(57) ABSTRACT

A flash memory apparatus and an initialization method for programming operation thereof are provided. The initialization method includes: providing a plurality of increasing programming pulse voltages to operate a plurality of without program inhibit programming actions on memory cells of the flash memory, and operating a plurality of programming verification actions on the memory cells according to a programming verification voltage; obtaining a recorded programming voltage value according verified results of the programming verification actions; providing a plurality of increasing reading pulse voltages to operate a plurality of reading actions on the memory cells; obtaining a recorded reading voltage value according to read result of the reading actions; and obtaining an initial programming voltage and an incremental step programming pulse voltages according to the recorded programming voltage value, the recorded reading voltage value and a voltage value of the programming verification voltage.

14 Claims, 3 Drawing Sheets

FLASH MEMORY APPARATUS AND INITIALIZATION METHOD FOR PROGRAMMING OPERATION THEREOF

CROSS-REFERENCE TO RELATED APPLICATION

This application claims the priority benefit of Taiwan application serial no. 104121667, filed on Jul. 3, 2015. The entirety of the above-mentioned patent application is hereby incorporated by reference herein and made a part of this specification.

BACKGROUND OF THE INVENTION

1. Field of the Invention

The present invention generally relates to flash memory apparatus and initialization method for programming operation, in particular, to an initialization for incremental step pulse programming (ISPP).

2. Description of Related Art

As the popularization of electronic apparatus, to satisfy the need of a large amount of information used by the user, it is one of essential requirements for the electronic apparatus to provide data storage medium with good quality. For the current state in the art, the flash memory as the data storage medium with capability to write in and read out data has been an essential part of the electronic apparatus.

The operation for programming the flash memory can be performed by using the technology of ISPP. The ISPP operation uses multiple pulses with incrementing voltages to program the memory cells. The distribution state of threshold voltages of the memory cells after programming the cells can be controlled by the factors of pulse voltage level, the number of pulse being applied and pulse width. In order to effectively control the distribution range of threshold voltages of the memory cells after programming the cells and effectively control the time in need for programming the cells, setting an initial programming voltage is an essential issue for the one with skill in the art.

SUMMARY OF THE INVENTION

The present invention provides a lash memory apparatus and initialization method for programming operation, capable of effectively figuring out the initial programming voltage and the voltage increment of the programming pulses.

In the present invention, an initialization method for programming flash memory includes providing a plurality of programming pulse voltages to operate a plurality of programming actions without inhibiting function on memory cells of the flash memory, wherein the voltage values of the programming pulse voltages are incremental. After each time of the programming actions, a programming verification action is performed on the memory cells by using a programming verification voltage. According to verified results of the programming verification actions, a current one of voltage values of the programming pulse voltages corresponding to the programming actions with respect to the programming verification actions is recorded as a recorded programming voltage value. After the programming actions, a plurality of reading pulse voltages is applied to perform a plurality of reading actions on the memory cells, wherein voltages values of the reading pulse voltages are incremental. According to reading results of the reading actions, a current one of voltage values of the reading pulse voltages is recorded as a recorded reading voltage value. According to the recorded programming voltage value, the recorded reading voltage value and the voltage value of the programming verification voltage, an initial programming voltage and a voltage increment of the programming pulse voltages are obtained.

In an embodiment of the invention, the step of recording the current one of voltage values of the programming pulse voltages corresponding to the programming actions with respect to the programming verification actions as the recorded programming voltage value, according to the verified result of the programming verification action, under without inhibiting function, includes: recording the current one of the voltage values of the programming pulse voltages corresponding to the programming actions with respect to the programming verification actions as the recorded programming voltage value when the programming verification action has verified that the number of the memory cells with threshold voltage values less than programming verification voltage is smaller than a predetermined reference value.

In an embodiment of the invention, the step of recording the current one of voltage values of the reading pulse voltages, according to reading results of the reading actions, under reading actions with incrementing pulses, includes recording the current one of voltage values of the reading pulse voltages as the recorded reading voltage value when the number of the memory cells with threshold voltage values greater than voltage value of the corresponding reading pulse voltage in the corresponding reading action is smaller than a predetermined reference value.

In an embodiment of the invention, the step of obtaining the initial programming voltage, according to the recorded programming voltage value, the recorded reading voltage value and the voltage value of the programming verification voltage, includes setting the initial programming voltage as $Vn-RDm+PVn+Voffset$, in which $Vn$ is the recorded programming voltage value, $RDm$ is the recorded reading voltage value, $PVn$ is a voltage value of a general programming verification action, and $Voffset$ is a voltage offset as predetermined.

In an embodiment of the invention of the above initialization method, the voltage offset is greater than, less than or equal to 0 volt. The voltage offset is determined by a programming threshold voltage distribution of the memory cells and an expected decreasing amount after erasing the memory cells.

In an embodiment of the invention, the initialization method with the programming actions further includes calculating the voltage increment of the programming pulse voltages according to the recorded programming voltage value, the recorded reading voltage value and a predetermined number of the programming actions.

In an embodiment of the invention, the initialization method with the programming actions further includes: storing the recorded programming voltage value, the recorded reading voltage value, the voltage value of the programming verification voltage, and a voltage value of a general programming verification action into a controller of the flash memory.

A flash memory apparatus of the invention includes a plurality of memory cells, a sensing circuit, and a controller. The memory cells form a memory cell array. The sensing circuit is coupled to the memory cell array. The controller is coupled to the sensing circuit and the memory cell array. The controller provides a plurality of programming voltages to perform a plurality of programming actions on the memory cells of the flash memory, wherein voltage values of the programming voltages are incremental. After each time of the programming actions, a programming verification action is performed on the memory cells by using a programming verification voltage. According to verified results of the programming verification actions, a current one of voltage values of the programming pulse voltages corresponding to the programming actions with respect to the programming verification actions is recorded as a recorded programming voltage value. After the programming actions, a plurality of reading pulse voltages is applied to perform a plurality of reading actions on the memory cells, wherein voltages values of the reading pulse voltages are incremental. According to reading results of the reading actions, a current one of voltage values of the reading pulse voltages is recorded as a recorded reading voltage value. According to the recorded programming voltage value, the recorded reading voltage value and the voltage value of the programming verification voltage, an initial programming voltage and a voltage increment of the programming pulse voltages are obtained.

As to the foregoing descriptions, the invention performs the multiple programming actions on the memory cells without inhibiting function and the recorded programming voltage value is obtained by programming verification actions. The recorded reading voltage is obtained according to the reading results of the multiple reading actions. The initial programming voltage can be calculated out, according to the recorded programming voltage value, the recorded reading voltage value and the voltage value of the programming verification voltage, and then the initialization action can accomplish in the programming action.

In an embodiment of the invention, the action of the controller can be done by issuing instructions from an external testing apparatus or an external control circuit and the controller executes the corresponding actions. The external testing apparatus or the external control circuit records the recorded programming voltage value, the recorded reading voltage value and the voltage value of the programming verification voltage to obtain the initial programming voltage and the voltage increment of the programming pulse voltages.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
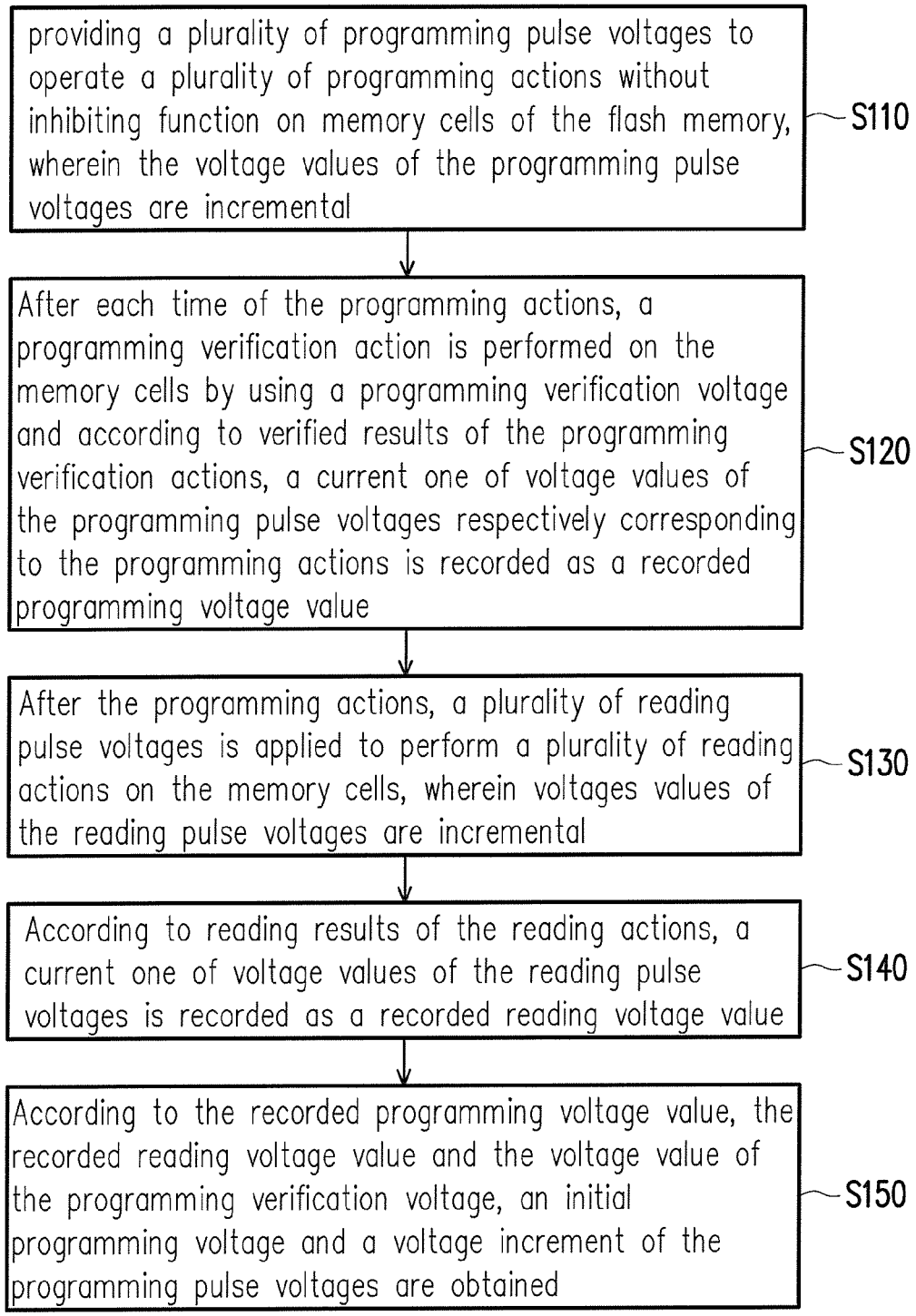
FIG. 1 is a drawing, schematically illustrating the flow chart of the initialization method for programming operation in the flash memory, according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
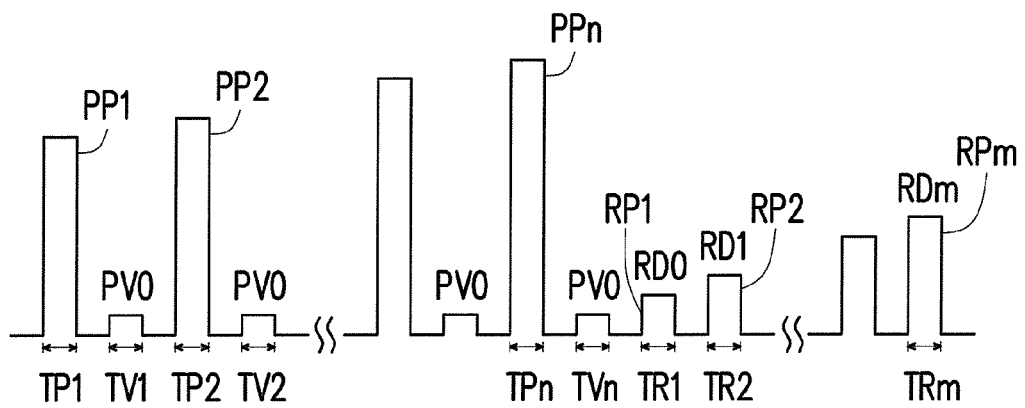
FIG. 2A is a drawing, schematically illustrating the waveform of the pulses for the initialization steps of programming operation, according to an embodiment of the invention.

FIG. 1 is a drawing, schematically illustrating the flow chart of the initialization method for programming operation in the flash memory, according to an embodiment of the invention. Referring to FIG. 1, in step S110, a plurality of programming pulse voltages is provided to operate a plurality of programming actions without inhibiting function on memory cells of the flash memory, wherein the voltage values of the programming pulse voltages are incremental. In detail, please also referring FIG. 2A. FIG. 2A is a drawing, schematically illustrating the waveform of the pulses for the initialization steps of programming operation, according to an embodiment of the invention. Corresponding to the step S110, for the multiple continuous time periods TP1-TPn as shown in FIG. 2A, multiple pulses PP1-PPn are respectively provided to perform programming actions on the memory cells of the flash memory. In addition, the pulses PP1-PPn, serving as the programming pulse voltages, have the voltage values V1-Vn, which are incremental. In other words, it has the relation that voltage value V1<voltage value V2< . . . <voltage value Vn.

Remarkably, the program without inhibiting function means that the programming actions are performed without inhibiting function during the initialization operation. That is, all of the memory cells are executed by the programming action.

Referring FIG. 1 again, on the other hand, in step S120, after each time of the programming actions, a programming verification action is performed on the memory cells by using a programming verification voltage. According to verified results of the programming verification actions, a current one of voltage values of the programming pulse voltages respectively corresponding to the programming actions is recorded as a recorded programming voltage value. Also referring to FIG. 2A, multiple continuous time periods TV1-TVn are set in the time gaps between the time periods TP1-TPn. Each adjacent two time periods, such as TP1 and TP2, has a time period, such as time period TV1. The time periods TV1-TVn are used to perform programming verification action. During the time periods TV1-TVn, multiple pulses with the voltage values equal to the programming verification voltage PV0 are provided to perform programming verification action on the memory cells.

In FIG. 2A, the programming verification actions during the time periods TV1-TVn are used to verify whether or not the number of the memory cells with the threshold voltage less than the programming verification voltage PV0 is smaller than a first predetermined reference value. When the number of the memory cells with the threshold voltage less than the programming verification voltage PV0 is smaller than the first predetermined reference value, it indicates that there are sufficient amount of memory cells having been programmed and stopping the programming actions. In FIG. 2A, all of the programming actions before the time period TVn do not succeed. In detail, before the time period TPn, the number of the memory cells with the threshold voltage less than the programming verification voltage PV0 is greater than the first predetermined reference value. At the time period TVn for programming verification action, it turns out that the number of the memory cells with the threshold voltage less than the programming verification voltage PV0 is smaller than the first predetermined reference value. This indicates that there are sufficient amount of memory cells having been programmed. In the following time period, it needs not to further provide pulse for programming action.

In addition, the predetermined reference value can be 0 or greater than 0. The predetermined reference value is set to exclude the effect caused by the tail bit. In detail, the flash memory usually has one or few memory cells, which have too-small capability in shifting the threshold voltage during programming action and cannot be effectively programmed. Usually, the bit of this memory cell is called tail bit. In an embodiment, in order to improve the performance of the flash memory, the memory cells of these tail bits can be excluded. In an embodiment, the quantity of the first predetermined reference value can be set according to the number of the memory cells of tail bit.

Figure 2B:
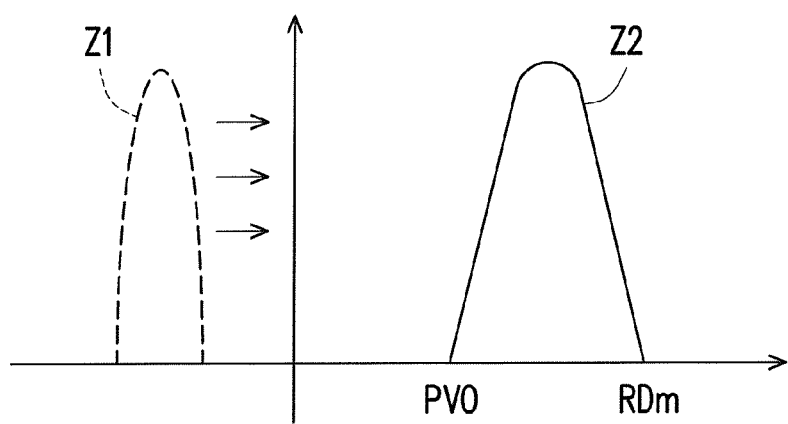
FIG. 2B is a drawing, schematically illustrating a threshold voltage distribution of the memory cells in the initialization steps of programming operation, according to an embodiment of the invention.

FIG. 2B is a drawing, schematically illustrating a threshold voltage distribution of the memory cells in the initialization steps of programming operation, according to an embodiment of the invention. Also referring FIG. 2B, before executing the initialization step of the programming action, the threshold voltage distribution of the memory cells is at the erased state Z1. By executing the steps S110 and S120 and after the time period TVn, the threshold voltage distribution of the memory cells has changed to the programmed state Z2. Most of the threshold voltages of the memory cells at the programmed state Z2 are greater than the programming verification voltage PV0.

Referring back to FIG. 1 again, after the foregoing programming actions, the step S130 is executed, in which multiple reading pulse voltage are provided to perform multiple reading actions on the memory cells, wherein the voltage values of the programming pulse voltages are incremental. In detail, referring to FIG. 2A, during the time periods TR1-TRm, multiple pulses RP1-RPm are respectively applied to perform multiple reading actions on the memory cells. The pulses RP1-RPm respectively have the reading voltages RD1-RDm. The reading voltages RD1-RDm have the relation of reading voltage RD1<reading voltage RD2< . . . <reading voltage RDm.

In step S140, according to reading results of the reading actions, a current one of voltage values of the reading pulse voltages is recorded as a recorded reading voltage value. In other words, during the time periods TR1-TRm, reading results respectively corresponding to the reading actions are judged. As an example, when the reading results of the reading actions at the time periods before the time period TRm show that all of the read bits are not all equal to "1", it indicates that the reading result is a failure and a next reading action is still in need. When the reading result of the reading action at the time period TRm shows that all of the read bits are equal to "1", it indicates that the reading result is a success, and there is no need for further reading action.

In the embodiment, during the time period TRm, the reading result by the reading pulse voltage RDm is a success. As shown in FIG. 2B, the number of the memory cells in the programmed state Z2 having threshold voltages greater than the reading pulse voltage RDm is less than a second predetermined reference value. In other words, after excluding the effect from tail bits, a maximum of the threshold voltages for the memory cells is about equal to the reading pulse voltage RDm. At the same time, reading action can stop and the reading pulse voltage RDm is recorded as the recorded reading voltage value.

In addition, quantities of the first predetermined reference value and the second predetermined reference value can be determined according to physical state of the memory cells of the flash memory. The first predetermined reference value and the second predetermined reference value can be the same or different.

Referring back to FIG. 1, after obtaining the recorded programming voltage value and the recorded reading voltage value, in step S150, an initial programming voltage can be obtained, according to the recorded programming voltage value, the recorded reading voltage value and the voltage value of the programming verification voltage. The initial programming voltage is equal to Vn−RDm+PVn+Voffset, in which Vn is the recorded programming voltage value, RDm is the recorded reading voltage value, PVn is a voltage value of a general programming verification action, and Voffset is a voltage offset as predetermined.

Remarkably, the predetermined voltage offset Voffset can be set by engineer according to the actual need and the actual status of the flash memory, wherein the predetermined voltage offset Voffset can be greater than, smaller than, or equal to 0 volt.

On the other hand, if the number of programming actions for the flash memory is a determined number and then the voltage increment of the programming pulse voltages can be equal to (RDm−PV0)/COUNT. COUNT is the number of programming actions when the voltages of the programming actions are performed on the memory cells of the flash memory by incrementing step-by-step.

Further, the recorded programming voltage value Vn, the recorded reading voltage value RDm, the voltage value of the programming verification voltage PV0 and the voltage value of a general programming verification action can be stored in the controller of the flash memory. When the flash memory wants to program the memory cells by itself, the initial programming voltage and the voltage increment of the programming pulse voltages can be set by using the recorded programming voltage value Vn, the recorded reading voltage value RDm, the voltage value of the programming verification voltage PV0 and the voltage value of a general programming verification action, so the programming operation by the incremental step pulses can be executed.

Figure 3:
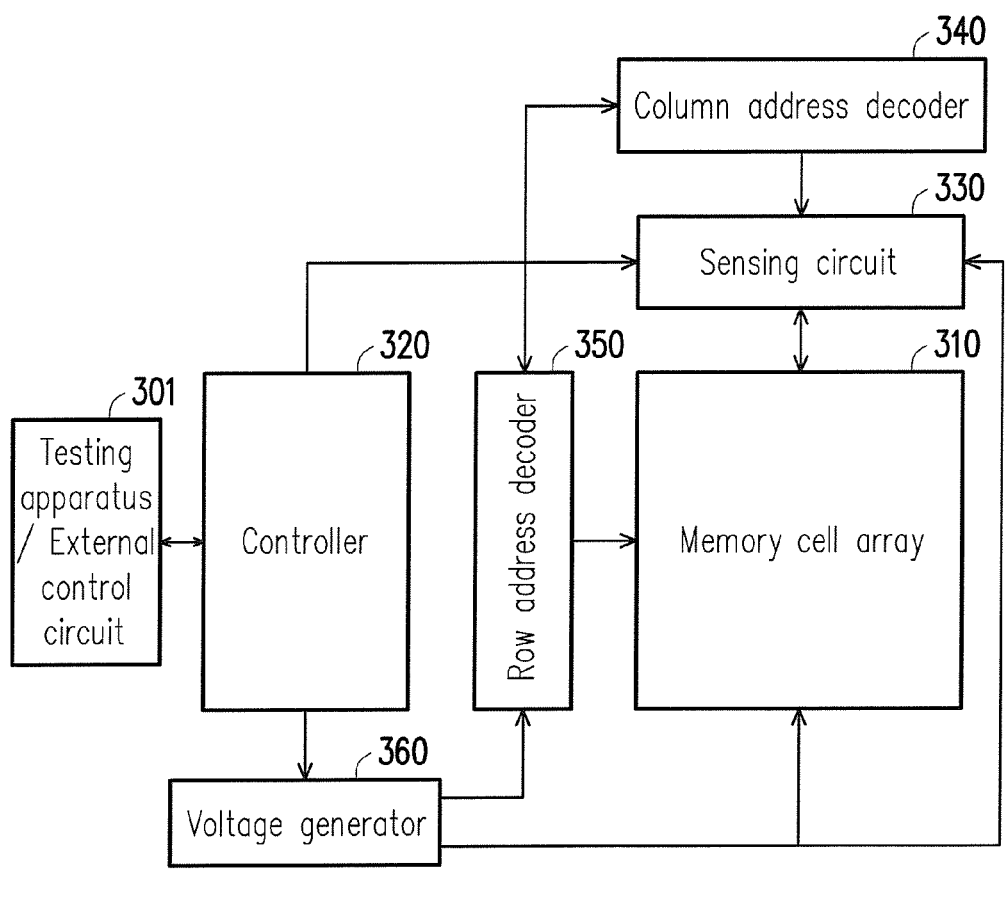
FIG. 3 is a drawing, schematically illustrating a flash memory apparatus, according to an embodiment of the invention.

FIG. 3 is a drawing, schematically illustrating a flash memory apparatus, according to an embodiment of the invention. Referring to FIG. 3, the flash memory apparatus 300 includes a memory cell array 310 formed from multiple memory cells, a controller 320, a sensing circuit 330, a column address decoder 340, a row address decoder 350, and a voltage generator 360. The sensing circuit 330 is coupled to the memory cell array 310. The controller 320 is coupled to the sensing circuit 330, the memory cell array 310, the column address decoder 340, the row address decoder 350, and the voltage generator 360.

In an embodiment, the controller 320 is also coupled to a testing apparatus or external control circuit 301. The testing apparatus 301 issues the testing instruction, which is executed by the controller 320, such as the action steps during initialization as shown in FIG. 1. Remarkably, the testing apparatus 301 can be a testing machine external from the flash memory apparatus 300 or a built-in self test (BIST) inside as a part of the flash memory apparatus 300.

The initialization steps for the programming operation in detail have been described in the foregoing descriptions and are not further described again.

As to the foregoing descriptions, the invention provides the initialization method for programming operation. The recorded programming voltage value can be obtained by applying multiple programming actions. The recorded reading voltage value can be obtained by applying multiple reading actions. The threshold voltage distribution of the programmed memory cells can be obtained from the recorded programming voltage value and the recorded reading voltage value. As a result, the initial programming voltage can be effectively obtained and the programming operation of the flash memory can be efficiently performed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An initialization method for programming flash memory comprising:
   providing a plurality of programming pulse voltages to operate a plurality of programming actions without inhibiting function on memory cells of the flash memory, wherein the voltage values of the programming pulse voltages are incremental;
   performing a programming verification action on the memory cells by using a programming verification voltage after each time of the programming actions, and recording a current one of voltage values of the programming pulse voltages corresponding to the programming actions with respect to the programming verification actions as a recorded programming voltage value, according to verified results of the programming verification actions;
   providing a plurality of reading pulse voltages after the programming actions to perform a plurality of reading actions on the memory cells, wherein voltages values of the reading pulse voltages are incremental;
   recording a current one of the voltage values of the reading pulse voltages as a recorded reading voltage value, according to reading results of the reading actions; and
   obtaining an initial programming voltage and a voltage increment of the programming pulse voltages according to the recorded programming voltage value, the recorded reading voltage value and a voltage value of the programming verification voltage.

2. The initialization method in claim 1, wherein the step of recording the current one of the voltage values of the programming pulse voltages corresponding to the programming actions with respect to the programming verification actions as the recorded programming voltage value, according to the verified results of the programming verification actions comprises:
   recording the current one of the voltage values of the programming pulse voltages corresponding to the programming actions with respect to the programming verification actions as the recorded programming voltage value when the programming verification action has verified the number of the memory cells with threshold voltage values less than the programming verification voltage being smaller than a predetermined reference value.

3. The initialization method in claim 1, wherein the step of recording the current one of the voltage values of the reading pulse voltages as the recorded reading voltage value, according to the reading results of the reading actions comprises:
   recording the current one of the voltage values of the reading pulse voltages as the recorded reading voltage value when the number of the memory cells with threshold voltage values greater than the voltage value of the corresponding reading pulse voltage in the corresponding reading action is smaller than a predetermined reference value.

4. The initialization method in claim 1, wherein the step of obtaining the initial programming voltage according to the recorded programming voltage value, the recorded reading voltage value and the voltage value of the programming verification voltage comprises:
   setting the initial programming voltage to be equal to Vn−RDm+PVn+Voffset,
   wherein the Vn is the recorded programming voltage value, the RDm is the recorded reading voltage value, the PVn is a voltage value of a general programming verification action, and the Voffset is a voltage offset as predetermined.

5. The initialization method in claim 4, wherein the voltage offset is greater than, less than or equal to 0 volt, wherein the voltage offset is determined by a programming threshold voltage distribution of the memory cells and an expected decreasing amount after erasing the memory cells.

6. The initialization method in claim 1, further comprising:
   calculating the voltage increment of the programming pulse voltages according to the recorded programming voltage value, the recorded reading voltage value and a predetermined number of the programming actions.

7. The initialization method in claim 4, further comprising:
   storing the recorded programming voltage value, the recorded reading voltage value, the voltage value of the programming verification voltage, and a voltage value of a general programming verification action into a controller of the flash memory.

8. A flash memory apparatus, comprising:
   a plurality of memory cells to form a memory cell array;
   a sensing circuit, coupled to the memory cell array; and
   a controller, coupled to the sensing circuit and the memory cell array,
   wherein the controller is coupled to a testing apparatus and the testing apparatus performs:
   providing a plurality of programming voltages to perform a plurality of programming actions on the memory cells of the flash memory apparatus, wherein voltage values of the programming voltages are incremental;
   performing a programming verification action on the memory cells by using a programming verification voltage after each time of the programming actions, and recording a current one of voltage values of the programming pulse voltages corresponding to the programming actions with respect to the programming verification actions as a recorded programming voltage value, according to verified results of the programming verification actions;
   providing a plurality of reading pulse voltages after the programming actions to perform a plurality of reading actions on the memory cells, wherein voltages values of the reading pulse voltages are incremental;
   recording a current one of the voltage values of the reading pulse voltages as a recorded reading voltage value, according to reading results of the reading actions; and
   obtaining an initial programming voltage according to the recorded programming voltage value, the recorded reading voltage value and a voltage value of the programming verification voltage.

9. The flash memory apparatus of claim 8, wherein the testing apparatus an external testing apparatus and external control circuit.

10. The flash memory apparatus of claim 8, wherein the testing apparatus records the current one of the voltage values of the programming pulse voltages corresponding to the programming actions with respect to the programming verification action as the recorded programming voltage value when the programming verification action has verified the number of the memory cells with threshold voltage values less than the programming verification voltage being smaller than a predetermined reference value.

11. The flash memory apparatus of claim 8, wherein the testing apparatus records the current one of the voltage values of the reading pulse voltages as the recorded reading voltage value when the number of the memory cells with threshold voltage values greater than the voltage value of the corresponding reading pulse voltage in the corresponding reading action is smaller than a predetermined reference value.

12. The flash memory apparatus of claim 8, wherein the testing apparatus sets the initial programming voltage to be equal to Vn−RDm+PVn+Voffset, where the Vn is the recorded programming voltage value, the RDm is the recorded reading voltage value, the PVn is a voltage value of a general programming verification action, and the Voffset is a voltage offset as predetermined.

13. The flash memory apparatus of claim 8, wherein the testing apparatus further calculates a voltage increment of the programming pulse voltages according to the recorded programming voltage value, the recorded reading voltage value and a predetermined number of the programming actions.

14. The flash memory apparatus of claim 13, wherein the recorded programming voltage value, the recorded reading voltage value, the voltage value of the programming verification voltage, the voltage offset, a voltage value of a general programming verification action, the initial programming voltage, and the voltage increment of the programming pulse voltages into a controller of the flash memory apparatus.

* * * * *